US008413576B2

(12) United States Patent
Li et al.

(10) Patent No.: US 8,413,576 B2
(45) Date of Patent: Apr. 9, 2013

(54) METHOD OF FABRICATING A STRUCTURE

(75) Inventors: Shunpu Li, Ontario (GB); Christopher Newsome, Cambridge (GB); Daping Chu, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 1201 days.

(21) Appl. No.: 11/763,092

(22) Filed: Jun. 14, 2007

(65) Prior Publication Data

US 2008/0006161 A1    Jan. 10, 2008

(30) Foreign Application Priority Data

Jul. 10, 2006  (JP) ................................. 2006-188925

(51) Int. Cl.
*B31F 1/07* (2006.01)

(52) U.S. Cl.
USPC ............................................. 101/32; 101/3.1

(58) Field of Classification Search .................. 101/3.1, 101/32, 4
See application file for complete search history.

(56) References Cited

U.S. PATENT DOCUMENTS

| | | | |
|---|---|---|---|
| 2004/0029382 A1* | 2/2004 | Kawase ......................... 438/689 |
| 2004/0213954 A1* | 10/2004 | Bourdelais et al. ........... 428/119 |
| 2005/0266693 A1 | 12/2005 | Maekawa | |
| 2006/0065136 A1* | 3/2006 | Takahashi et al. ............. 101/3.1 |
| 2006/0084206 A1* | 4/2006 | Moriya et al. ................ 438/149 |
| 2006/0088998 A1 | 4/2006 | Moriya et al. | |
| 2006/0110545 A1 | 5/2006 | Toyoda | |
| 2006/0131753 A1* | 6/2006 | Rantala et al. ................ 257/759 |
| 2007/0287270 A1* | 12/2007 | Li et al. ......................... 438/478 |
| 2008/0032472 A1* | 2/2008 | Yu et al. ........................ 438/250 |
| 2009/0212462 A1* | 8/2009 | Kruijt-Stegeman et al. .......................... 264/297.4 |

FOREIGN PATENT DOCUMENTS

| | | |
|---|---|---|
| JP | A 2006-019707 | 1/2006 |
| JP | A 2006-066673 | 3/2006 |
| JP | A 2006-128239 | 5/2006 |
| JP | A 2006-156426 | 6/2006 |

OTHER PUBLICATIONS

S. Matsui, "Nanoimprint Technology", Surface Science, vol. 25, No. 10, 2004, pp. 628-634.

* cited by examiner

*Primary Examiner* — Daniel J Colilla
*Assistant Examiner* — David Banh
(74) *Attorney, Agent, or Firm* — Oliff & Berridge, PLC

(57) ABSTRACT

A method of fabricating a bank structure, includes: (a) forming a multi-layer structure on an underlying surface thereof, the multi-layer structure having at least a first layer and a second layer, (b) embossing the second layer so as to define a bank pattern in the second layer, (c) transferring the bank pattern to the first layer so as to form a bank structure defining an indented region; and (d) removing the second layer after the step (c) so as to expose a surface of the first layer as a top surface of the bank structure.

10 Claims, 14 Drawing Sheets

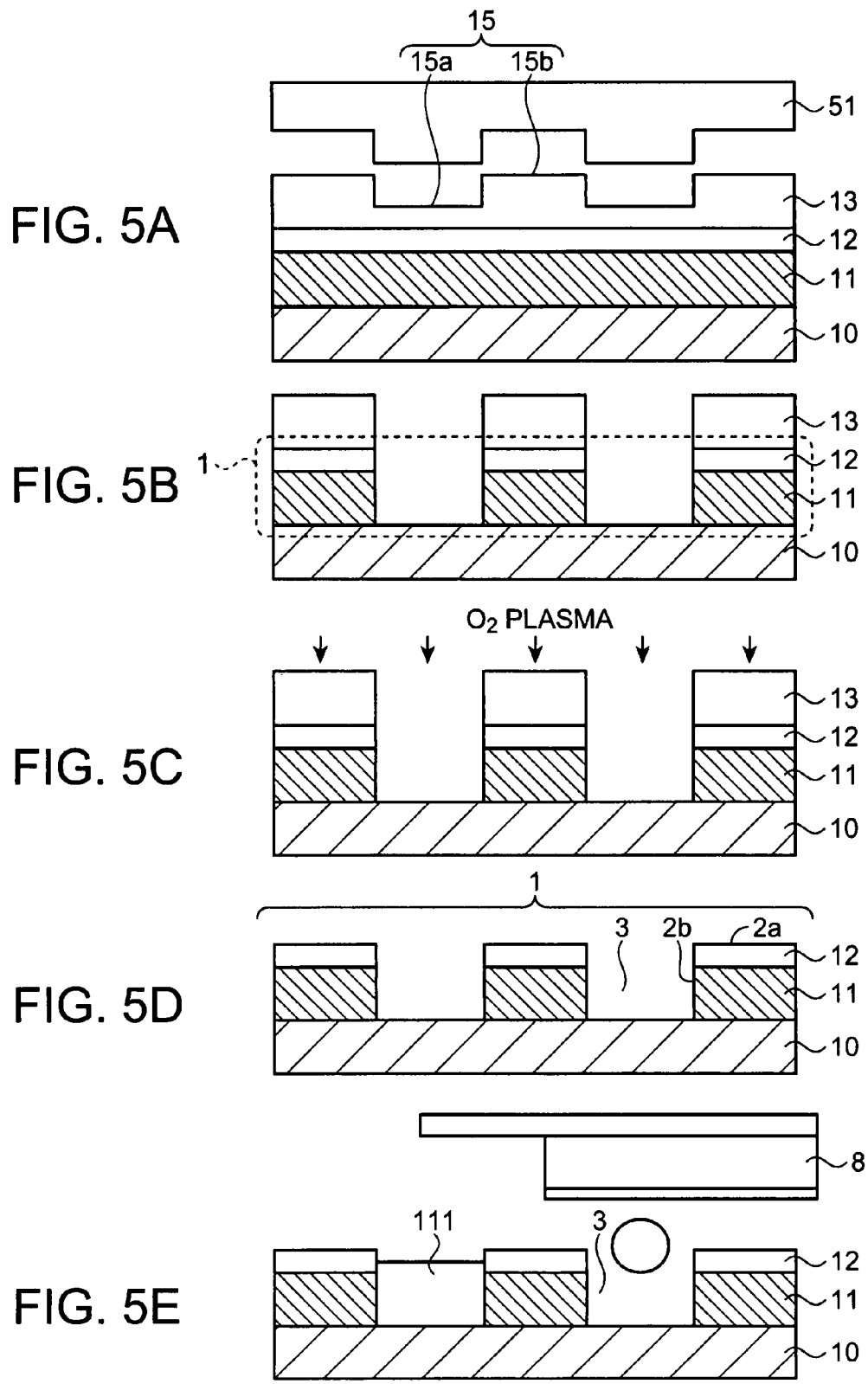

METHOD OF FABRICATING A STRUCTURE

The entire disclosure of Japanese Patent Application No. 2006-188925, filed Jul. 10, 2006, is expressly incorporated by reference herein.

BACKGROUND

1. Technical Field

Several aspects of this invention relate to a method of fabricating a bank structure, and particularly to a method of fabricating a bank structure used in electronic device fabrication utilizing an ink-jet process.

2. Related Art

JP-A-2006-66673 discloses the formation of conductive patterns on areas defined by a bank pattern. Nano-imprinting is another known technique for forming fine patterns [Shinji Matsui, Surface Science Vol. 25, No. 10, pp. 628-634 (2004)].

SUMMARY

If bank patterns are formed by a photolithography process, it may be difficult to reduce fabrication costs, because the photolithography process requires expensive exposure equipment. Meanwhile, a nano-imprinting/micro-embossing process provides high-quality and high-resolution patterning at low fabrication cost.

In view of the above, one objective of the invention is to provide a method of fabricating a bank structure at low fabrication cost.

According to an aspect of the invention, a method of fabricating a bank structure includes: (a) forming a first layer on an underlying surface thereof, (b) forming a wetting modification layer on the first layer, (c) forming a second layer on the wetting modification layer, (d) embossing the second layer so as to define a bank pattern in the second layer, (e) transferring the bank pattern to the first layer through the wetting modification layer so as to form a bank structure defining an indented region, and (f) removing the second layer after the process described in (e) so that a surface of the wetting modification layer is exposed as a top surface of the bank structure.

According to another aspect of the invention, the step (d) includes forming an indentation and a protrusion that define the bank pattern in the second layer, and the step (e) includes etching the First layer and the wetting modification layer using the second layer as a mask.

According to another aspect of the invention, the degree of hydrophobicity of the wetting modification layer is greater than that of the first layer.

According to another aspect of the invention, the abovementioned method of fabricating a bank structure further include (g) increasing the degree of hydrophilicity of a side surface of the bank structure between the steps (e) and (f), so that the bank structure has a wetting contrast between the side surface and the top surface.

According to another aspect of the invention, the degree of oleophobicity of the wetting modification layer is greater than that of the first layer.

According to another aspect of the invention, the abovementioned method of fabricating a bank structure further includes (g) increasing the degree of oleophilicity of a side surface of the bank structure between steps (e) and (f), so that the bank structure has a wetting contrast between the side surface and the top surface.

According to another aspect of the invention, the indented region has a depth of at least about 2 μm.

According to another aspect of the invention, the indented region has a lateral dimension and a vertical dimension that are in a range from sub-micrometer to millimeter.

According to another aspect of the invention, the indented region has a shape of a line, square, circle, parallelogram, hexagon, or any combination thereof.

According to an aspect of the invention, a method of forming a pattern includes: (a) forming a first layer on an underlying surface thereof, (b) forming a wetting modification layer on the first layer, (c) forming a second layer on the wetting modification layer, (d) embossing the second layer so as to define a bank pattern in the second layer, (e) transferring the bank pattern to the first layer through the wetting modification layer so as to form a bank structure defining an indented region, (f) removing the second layer after the step (e) so that a surface of the wetting modification layer is exposed as a top surface of the bank structure, and (g) providing a functional liquid containing a predetermined material in the indented region so that a pattern containing the material is formed in the indented region.

According to another aspect of the invention, the step (g) includes (g1) ejecting droplets of the functional liquid from an ink-jet head so as to provide the functional liquid in the indented region.

According to another aspect of the invention, the predetermined material includes a conductive material, and a conductive pattern is formed in the indented region.

According to another aspect of the invention, the predetermined material includes a ferroelectric material, and a ferroelectric pattern is formed in the indented region.

According to another aspect of the invention, the predetermined material includes a semiconductor material, and a semiconductor pattern is formed in the indented region.

According to another aspect of the invention, the predetermined material includes a dielectric material, and a dielectric pattern is formed in the indented region.

According to another aspect of the invention, the predetermined material includes an electroluminescent material, and an electroluminescent pattern is formed in the indented region.

According to another aspect of the invention, a method of fabricating an electronic circuit includes one of the abovementioned methods of forming a pattern.

According to another aspect of the invention, a method of fabricating an electronic device includes one of the abovementioned methods of forming a pattern.

According to another aspect of the invention, the indented region has a depth of at least about 2 μm.

According to an aspect of the invention, a bank structure is fabricated by a method includes: (a) forming a first layer on an underlying surface thereof, (b) forming a wetting modification layer on the first layer, (c) forming a second layer on the wetting modification layer, (d) embossing the second layer so as to define a bank pattern in the second layer, (e) transferring the bank pattern to the first layer through the wetting modification layer so as to form the bank structure defining an indented region; and (f) removing the second layer after the step (e) so that a surface of the wetting modification layer is exposed as a top surface of the bank structure.

According to another aspect of the invention, an electronic circuit comprises the above-mentioned bank structure and at least one of a conductive pattern, a ferroelectric pattern, a semiconductor pattern, a dielectric pattern and an electroluminescent pattern provided in the indented region.

According to another aspect of the invention, an electronic device, comprises the above-mentioned bank structure and at least one of a conductive pattern, a ferroelectric pattern, a semiconductor pattern, a dielectric pattern and an electroluminescent pattern provided in the indented region.

According to an aspect of the invention, a method of fabricating a bank structure includes: (a) forming a first layer covered with a wetting modification layer on an underlying surface thereof, (b) forming a second layer on the wetting modification layer, (c) embossing the second layer so as to define a bank pattern in the second layer, (d) transferring the bank pattern to the first layer through the wetting modification layer so as to form a bank structure defining an indented region; and (e) removing the second layer after the step (d) so that a surface of the wetting modification layer is exposed as a top surface of the bank structure.

According to another aspect of the invention, the step (c) includes forming an indentation and a protrusion that define the bank pattern in the second layer, and the step (d) includes etching the first layer and the wetting modification layer using the second layer as a mask.

According to another aspect of the invention, the step (a) includes depositing a solution including a first layer material and surfactants on the underlying surface, and baking the deposited solution so as to obtain the first layer and the wetting modification layer from the first layer material and the surfactants.

According to another aspect of the invention, the step (c) includes depositing a solution including a first layer material and a wetting modification layer material on the underlying surface so as to obtain the first layer and the wetting modification layer from the first layer material and the wetting modification layer material by phase separation.

According to another aspect of the invention, the step (c) includes forming the first layer on the underlying surface; and applying a physical or chemical treatment to the first layer so as to provide the wetting modification layer.

According to another aspect of the invention, the underlying surface is a surface of a self-assembled molecular-layer formed on an ITO electrode or substrate.

According to another aspect of the invention, the indented region has a lateral dimension and a vertical dimension that are in a range from sub-micrometer to millimeter.

According to another aspect of the invention, the indented region has a shape of a line, square, circle, parallelogram, hexagon, or any combination thereof.

According to an aspect of the invention, a method of forming a pattern, includes: (a) forming a first layer covered with a wetting modification layer on an underlying surface thereof, (b) forming a second layer on the wetting modification layer, (c) embossing the second layer so as to define a bank pattern in the second layer, (d) transferring the bank pattern to the first layer through the wetting modification layer so as to form a bank structure defining an indented region, (e) removing the second layer after the step (d) so that a surface of the wetting modification layer is exposed as a top surface of the bank structure; and (g) providing a functional liquid containing a predetermined material in the indented region so that a pattern containing the material is formed in the indented region.

According to another aspect of the invention, the step (g) includes (g1) ejecting droplets of the functional liquid from an ink-jet head so as to provide the functional liquid in the indented region.

According to another aspect of the invention, the predetermined material includes a conductive material, and a conductive pattern is formed in the indented region.

According to another aspect of the invention, the predetermined material includes a ferroelectric material, and a ferroelectric pattern is formed in the indented region.

According to another aspect of the invention, the predetermined material includes a semiconductor material, and a semiconductor pattern is formed in the indented region.

According to another aspect of the invention, the predetermined material includes a dielectric material, and a dielectric pattern is formed in the indented region.

According to another aspect of the invention, the predetermined material includes an electroluminescent material, and an electroluminescent pattern is formed in the indented region.

According to another aspect of the invention, a method of fabricating an electronic circuit includes one of the above-mentioned methods of forming a pattern.

According to another aspect of the invention, a method of fabricating an electronic device includes one of the above-mentioned methods of forming a pattern.

According to another aspect of the invention, the indented region has a depth of at least about 2 μm.

According to an aspect of the invention, a bank structure is fabricated by a method including: (a) forming a first layer covered with a wetting modification layer on an underlying surface thereof, (b) forming a second layer on the wetting modification layer, (c) embossing the second layer so as to define a bank pattern in the second layer, (d) transferring the bank pattern to the first layer through the wetting modification layer so as to form the bank structure defining an indented region; and (e) removing the second layer after the step (d) so that a surface of the wetting modification layer is exposed as a top surface of the bank structure.

According to another aspect of the invention, an electronic circuit includes the bank structure mentioned above and at least one of a conductive pattern, a ferroelectric pattern, a semiconductor pattern, a dielectric pattern and an electroluminescent pattern provided in the indented region.

According to another aspect of the invention, an electronic device includes the bank structure mentioned above and at least one of a conductive pattern, a ferroelectric pattern, a semiconductor pattern, a dielectric pattern and an electroluminescent pattern provided in the indented region.

According to an aspect of the invention, a method of fabricating a bank structure includes: (a) forming a first layer on an underlying surface thereof, (b) forming a second layer on the first layer, (c) embossing the second layer so as to define a bank pattern in the second layer, (d) transferring the bank pattern to the first layer so as to form a bank structure defining an indented region, and (e) removing the second layer after the step (d) so that a surface of the first layer is exposed as a top surface of the bank structure.

According to another aspect of the invention, the step (c) includes forming an indentation and a protrusion that define the bank pattern in the second layer, and the step (d) includes etching the first layer using the second layer as a mask.

According to another aspect of the invention, the above-mentioned method of fabricating a bank structure further includes (f) applying a physical or chemical treatment to a side surface of the bank structure between the steps (d) and (e), so that the side surface becomes hydrophilic if the first layer is hydrophobic.

According to another aspect of the invention, the above-mentioned method of fabricating a bank structure further includes (f) applying a physical or chemical treatment to a side surface of the bank structure between the steps (d) and (e), so that the side surface becomes oleophilic if the first layer is oleophobic.

According to another aspect of the invention, the above-mentioned method of fabricating a bank structure further includes (f) applying a physical or chemical treatment to a side surface of the bank structure between the steps (d) and (e), so that the side surface becomes hydrophobic if the first layer is hydrophilic.

According to another aspect of the invention, the above-mentioned method of fabricating a bank structure further includes (f) applying a physical or chemical treatment to a side surface of the bank structure between the steps (d) and (e), so that the side surface becomes oleophobic if the first layer is oleophilic.

According to another aspect of the invention, the indented region has a depth of at least about 2 µm.

According to another aspect of the invention, the indented region has a lateral dimension and a vertical dimension that are in a range from sub-micrometer to millimeter.

According to another aspect of the invention, the indented region is has a shape of a line, square, circle, parallelogram, hexagon or any combination thereof.

According to an aspect of the invention, a method of forming a pattern, includes: (a) forming a first layer on an underlying surface thereof, (b) forming a second layer on the first layer, (c) embossing the second layer so as to define a bank pattern in the second layer, (d) transferring the bank pattern to the first layer so as to form a bank structure defining an indented region; (e) removing the second layer after the step (d) so that a surface of the first layer is exposed as a top surface of the bank structure, and (g) providing a functional liquid containing a predetermined material in the indented region so that a pattern containing the material is formed in the indented region.

According to another aspect of the invention, the step (g) includes (g1) ejecting droplets of the functional liquid from an ink-jet head so as to provide the functional liquid in the indented region.

According to another aspect of the invention, the predetermined material includes a conductive material, and a conductive pattern is formed in the indented region.

According to another aspect of the invention, the predetermined material includes a ferroelectric material, and a ferroelectric pattern is formed in the indented region.

According to another aspect of the invention, the predetermined material includes a semiconductor material, and a semiconductor pattern is formed in the indented region.

According to another aspect of the invention, the predetermined material includes a dielectric material, and a dielectric pattern is formed in the indented region.

According to another aspect of the invention, the predetermined material includes an electroluminescent material, and an electroluminescent pattern is formed in the indented region.

According to another aspect of the invention, a method of fabricating an electronic circuit includes one of the above-mentioned methods of forming a pattern.

According to another aspect of the invention, a method of fabricating an electronic device includes one of the above-mentioned methods of forming a pattern.

According to another aspect of the invention, the indented region has a depth of at least about 2 µm.

According to an aspect of the invention, a bank structure is fabricated by a method including: (a) forming a first layer on an underlying surface thereof, (b) forming a second layer on the first layer, (c) embossing the second layer so as to define a bank pattern in the second layer, (d) transferring the bank pattern to the first layer so as to form the bank structure defining an indented region, and (e) removing the second layer after the step (d) so that a surface of the first layer is exposed as a top surface of the bank structure.

According to another aspect of the invention, an electronic circuit includes the bank structure mentioned above and at least one of a conductive pattern, a ferroelectric pattern, a semiconductor pattern, a dielectric pattern and an electroluminescent pattern provided in the indented region.

According to another aspect of the invention, an electronic device includes the bank structure mentioned above and at least one of a conductive pattern, a ferroelectric pattern, a semiconductor pattern, a dielectric pattern and an electroluminescent pattern provided in the indented region.

According to an aspect of the invention, a method of fabricating a bank structure includes: (a) forming a multi-layer structure on an underlying surface thereof, the multi-layer structure having at least a first layer and a second layer, (b) embossing the second layer so as to define a bank pattern in the second layer, (c) transferring the bank pattern to the first layer so as to form a bank structure defining an indented region; and (d) removing the second layer after the step (c) so as to expose a surface of the first layer as a top surface of the bank structure.

BRIEF DESCRIPTION OF THE DRAWINGS

FIGS. 5A to 5E are diagrams showing the fabrication method of example 1.

DESCRIPTION OF EXEMPLARY EMBODIMENTS

A method of fabricating a bank structure according to this embodiment is realized as part of a method of fabricating electronic devices. The term "electronic device" here includes, for instance, at least one of a ferroelectric device, a light emitting device, a thin film transistor, an electrochemical cell, a photovoltaic device, a liquid crystal display device, a plasma display device and an organic electro-luminescent display device.

The term "embossing process" includes at least one of micro-embossing and nano-imprinting. As described later, the term "embossing process" also includes, for instance, at least one of hot embossing, room temperature embossing and photo embossing. The term "ink-jet method" includes an ink-jet printing method. Additionally, the term "ink-jet process" means a process based on an ink-jet printing process, or ink-jet method.

The method of fabricating a bank structure of the embodiment includes, for instance, a step for embossing a multi-layer structure such as a double-layer structure or a tri-layer structure. In the following descriptions, forms and types of bank structure are briefly described first to facilitate understanding of this and other embodiments of the invention.

Figure 1A:
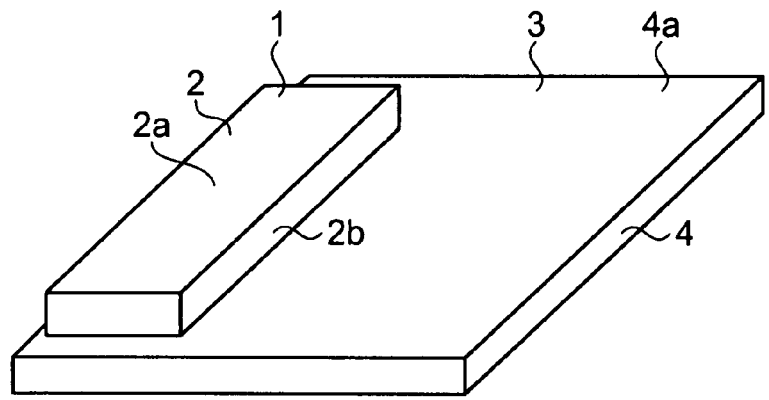
FIGS. 1A to 1C are diagrams illustrating bank structures of embodiments of the present invention.
Figure 1B:
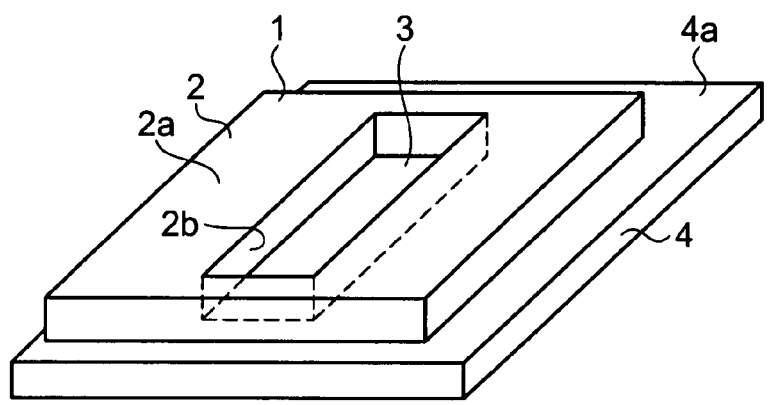

A. Forms of Bank Structure: FIGS. 1A and 1B illustrate bank structures 1 having banks 2 of predetermined thicknesses. Meanwhile, the bank structure 1 shown in FIG. 1C may have two or more banks 2 separated from each other. Each bank 2 in FIGS. 1A to 1C has a top surface 2a and a plurality of side surfaces 2b. Also, each bank 2 may be constituted of a single layer or a plurality of layers. Note that the "side surfaces 2b of the bank 2" are also referred to as the "side surfaces 2b of the bank structure 1" in the descriptions that follow.

Figure 1C:
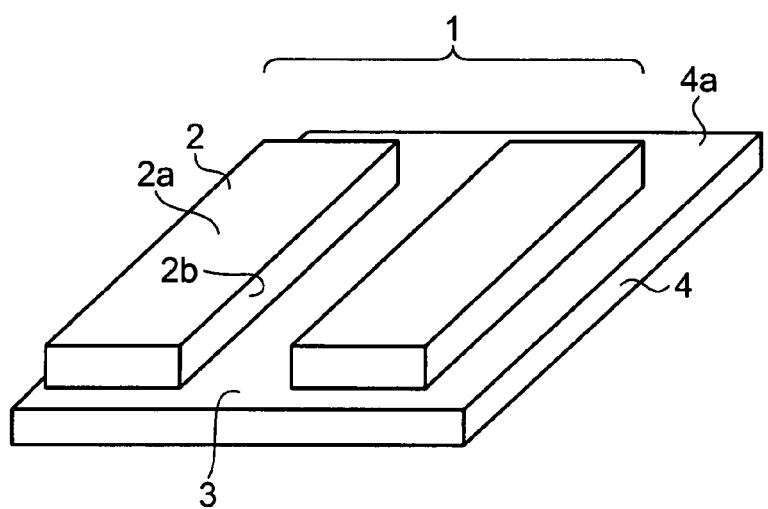

Once one of the bank structures 1 shown in FIGS. 1A to 1C has been formed on an underlying object 4, a portion of a surface at a lower level than that of the top surface 2a is defined by at least one of the side surfaces 2b, so that an indented region 3 having the portion as its bottom surface is formed. The surface at the lower level may be a surface 4a of the underlying object 4. The indented region 3 shown in FIG. 1A is open in directions where no side surface 2b is provided, while the indented region 3 shown in FIG. 1B is enclosed by the side surfaces 2b. Moreover, the indented region 3 shown in FIG. 1C is defined by the side surfaces 2b of the adjacent banks 2.

In the bank structure 1 shown in FIG. 1C, the indented region 3 takes the form of a trench. The bottom surface of the trench here is not necessarily surface 4a. Further, according to this embodiment, the length, width and depth and other dimensions of the trench are in a range from sub-micrometer to millimeter. Moreover, the depth of the trench may be equal to or greater than about 2 micrometers (μm). Note that a "trench" in this embodiment includes at least one of a groove and channel.

If the indented region 3 is in the form of a trench, the bottom surface of the indented region 3 is in the form of a line. However, if the indented region 3 has another form, the bottom surface may be in the form of, for instance, a square, circle, parallelogram, hexagon or any combination of these forms.

As mentioned above, the bank structure 1 has a predetermined thickness. Thus, after the bank structure 1 is provided on the underlying object 4, a "thickness contrast" corresponding to the thickness of the bank structure 1 is obtained on the underlying object 4. For this reason, the bank structure 1 is said to have a thickness contrast, and in this regard, the bank structure 1 is different from a surface energy contrast bank constituted of self-assembled molecular layers (SAMs).

The bank structure 1 shown in FIG. 1C is used to exemplify this embodiment in the descriptions that follow. However, these descriptions also basically apply to the bank structures 1 of FIGS. 1A and 1B.

B. Classification of Bank Structure Based on Wettability: From the point of view of an ink-jet printing application, the bank structures 1 may be classified into two types. According to one type, the top surfaces 2a and the side surfaces 2b have mutually different degrees of wettability. For instance, the top surfaces 2a may be hydrophobic, while the side surfaces 2b are hydrophilic. The bank structure 1 of this type may be referred to as a "wetting contrast bank structure". According to the other type, the top surfaces 2a and the side surfaces 2b have the same degree of wettability, so the bank structure 1 of this type may be referred to as a "uniform-wettability bank structure."

B1. Wetting Contrast Bank Structure: One important aspect of the "wetting contrast bank structure" is that it may assist the flow of liquid-like material provided in the channel or in the indented regions 3. This aspect, which is caused by the difference in wettability between the top surfaces 2a and the side surfaces 2b, makes the wetting contrast bank structure useful for an ink-jet printing method for printing patterns in high resolution.

Figure 2A:
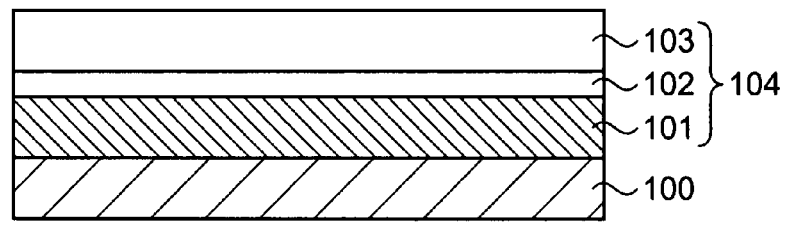
FIGS. 2A to 2C illustrate an outline of a tri-layer process of an embodiment of the present invention.
Figure 3A:
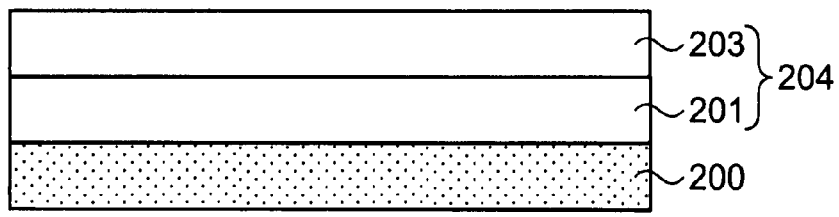
FIGS. 3A to 3C illustrate an outline of a double-layer process of an embodiment of the present invention.

A method of fabricating the wetting contrast bank structure includes, basically, forming a bank pattern in an upper layer using an embossing process, and transferring the bank pattern from the upper layer to a lower layer. In later sections of this specification, three different cases for realizing such a wetting contrast bank structure are described. In two of the three cases, a tri-layer structure 104 as shown in FIG. 2A is embossed, and in the other case, a double-layer structure 204 as shown in FIG. 3A is embossed.

B2. Uniform-Wettability Bank Structure: In the uniform-wettability bank structure, the printed liquid-like material flow may only be driven by a highly wetted bottom surface of the trench. This bank structure is less efficient than the wetting-contrast bank structure, but the fabrication process is simple.

A method of fabricating the uniform-wettability bank structure includes, basically, forming a bank pattern in an upper layer using an embossing process, and transferring the bank pattern from the upper layer to a lower layer. In this case, a double-layer structure 204 as shown in FIG. 3A is embossed during the embossing process.

This method is preferably used to fabricate the bank structure 1 that is shallow (several tens of nanometers) or thick (several tens of micrometers) over a very large area. The bank structure 1 that is shallow and in a range from several nanometers to several tens of nanometers, does not affect the topographies of ink-jet printed materials and therefore the subsequent bank removing process, which may damage the printed materials, may be avoided.

Here, a process that includes embossing the tri-layer structure 104 is an example of a tri-layer process, and a process that includes embossing the double-layer structure 204 is an example of a double-layer process.

According to the tri-layer process or to the double-layer process of this embodiment, the bank structure 1 is effectively fabricated even if the material constituting the bank structure 1 has a high melting point or a high glass transition temperature. For instance, such a bank structure 1 is fabricated by a method that includes transferring a bank pattern provided in a layer of a material having a low melting point to the layer of a material having a relatively high melting point.

C. Outlines of the Tri-layer and Double-layer Processes: The basic principle of the tri-layer process is described. According to the tri-layer process, the tri-layer structure 104 as shown in FIG. 2A is prepared. Here, the tri-layer structure 104 has a lower layer 101, a wetting modification layer 102 located on the lower layer 101, and an upper layer 103 located on the wetting modification layer 102. In FIG. 2A, the lower layer 101 is located on a substrate 100.

Figure 2B:
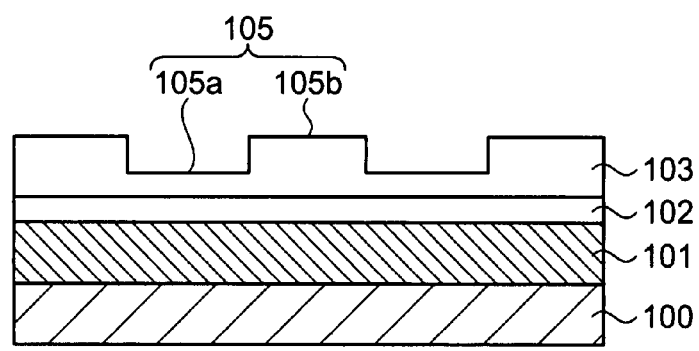

The upper layer 103 is then embossed by a stamp (not shown) so that a bank pattern 105 is provided in the upper layer 103 (FIG. 2B). The bank pattern 105 is defined by indentations 105a and protrusions 105b. The indentations 105a are portions of the upper layer 103 defined by the protrusions 105b. The surface of the stamp that provides the bank pattern 105 has a pattern inverse to the bank pattern 105.

Next, the bank pattern 105 is transferred from the upper layer 103 to the lower layer 101 through the wetting modification layer 102. In this embodiment, with the upper layer 103 functioning as a mask, the upper layer 103, the wetting modification layer 102 and the lower layer 101 are plasma etched. Here, the thickness of the upper layer 103 at the indentations 105a is less than that at the protrusions 105b. Hence, the etching proceeds faster at portions corresponding to the indentations 105a than at portions corresponding to the protrusions 105b, and thus the bank pattern 105 is transferred to the lower layer 101 through the wetting modification layer 102. This transfer provides the bank structure 1 having the side surfaces 2b that define the indented regions 3 (not shown in FIGS. 2A and 2B).

The upper layer 103 that remains is removed in a proper solvent. As a result, the separated surfaces of the etched wetting modification layer 102 are exposed as top surfaces 2a of the bank structure 1 shown in FIG. 2C.

Figure 2C:
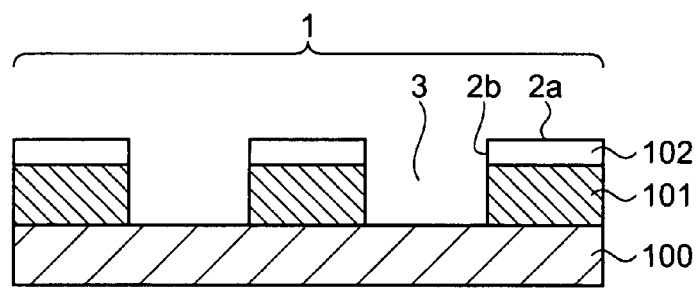

After the upper layer 103 that remains is removed, a functional liquid is provided in the indented regions 3 by the ink-jet printing method (not shown in FIG. 2C).

The wetting modification layer 102 may be either highly hydrophobic (oleophobic, lyophobic) or hydrophilic (oleophilic, lyophilic) depending on the specific need. The treatment before removing the embossed upper layer 103 may be different depending on whether the wetting modification layer 102 is hydrophobic (oleophobic, lyophobic) or hydrophilic (oleophilic, lyophilic). For instance, if the wetting modification layer 102 is hydrophobic, an oxygen plasma treatment may be applied to the etched tri-layer structure 104 so that the bottom surface and side surfaces of the indented regions 3 become hydrophilic. Conversely, if the wetting modification layer 102 is hydrophilic (such as a $SiO_2$ layer, Si layer, etc.), the etched tri-layer structure 104 may be treated by $CF_4$ plasma before the upper layer 103 that remains is removed so that the surfaces of the indented regions 3 become hydrophobic. In the latter case, the ink-jet printed aqueous ink may stay on the top surfaces 2a of the bank structure 1, which is useful for many applications.

The basic principle of the double-layer process is described. According to the double-layer process, the double-layer structure 204 as shown in FIG. 3A is prepared. The double-layer structure 204 has a lower layer 201 and an upper layer 203 located on the lower layer 201. In FIG. 3A, the lower layer 201 is located on a substrate 200.

Figure 3B:
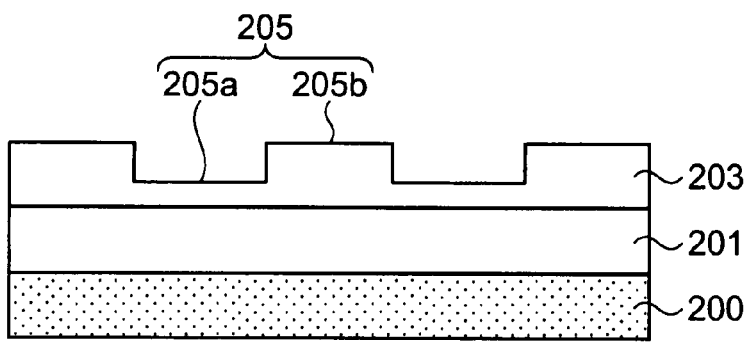

The upper layer 203 is then embossed by a stamp so that a bank pattern 205 is provided on the upper layer 203 (FIG. 3B). The bank pattern 205 is defined by indentations 205a and protrusions 205b in the upper layer 203 that is embossed. The indentations 205a are portions of the upper layer 203 defined by the protrusions 205b. The surface of the stamp that provides the bank pattern 205 has a pattern inverse to the bank pattern 205.

Next, the bank pattern 205 is transferred from the upper layer 203 to the lower layer 201. In this embodiment, with the upper layer 203 functioning as a mask, the upper layer 203 and the lower layer 201 are plasma etched. Here, the thickness of the upper layer 203 at the indentations 205a is less than that at the protrusions 205b. Therefore, the etching proceeds faster at portions corresponding to the indentations 205a than at portions corresponding to the protrusions 205b, and thus the bank pattern 205 is transferred to the lower layer 201. This transfer provides the bank structure 1 having the side surfaces 2b that define the indented regions 3 (not shown in FIGS. 3A and 3B).

The upper layer 203 that remains is removed in a proper solvent. As a result, the separated surfaces of the etched lower layer 201 are exposed as top surfaces 2a of the bank structure 1 as shown in FIG. 3C.

Figure 3C:
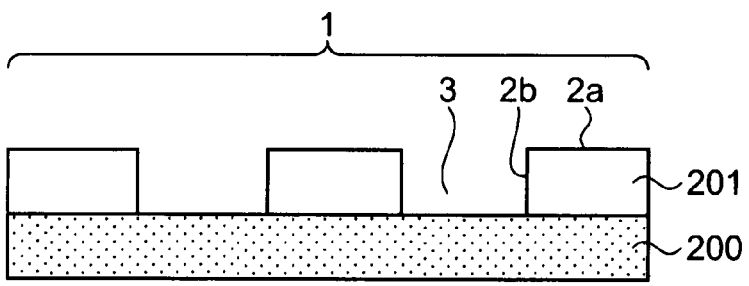

After the upper layer 203 that remains is removed, the functional liquid is provided in the indented regions 3 by the ink-jet printing method (not shown in FIG. 3C).

The double-layer process of FIGS. 3A to 3C may fabricate either the wetting contrast bank structure or the uniform wettability bank structure. For instance, a wetting contrast bank structure is obtained if the material constituting the lower layer 201 is itself sufficiently hydrophobic (oleophobic, lyophobic), and a chemical or physical treatment is applied to the bank structure 1 before the upper layer 203 that remains is removed so as to increase the degree of wettability of the bottom surfaces and the side surfaces of the trenches. "Chemical or physical treatment" here includes, for instance, at least one of a plasma treatment, a UV ray irradiation treatment, and formation of a self-assembled molecular layer.

Example 1

One example of a method of fabricating a wetting contrast bank structure by the tri-layer process is described in detail. FIGS. 4A to 5E are referred to in the following descriptions.

Figure 4A:
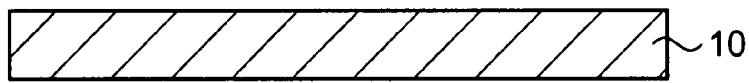
FIGS. 4A to 4D are diagrams showing a fabrication method of example 1.
Figure 4B:
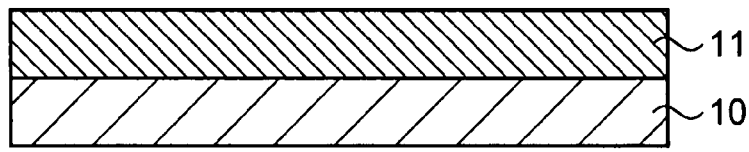

A material containing polymethylglutarimide (PMGI) is spin-coated on a silicon substrate 10 as shown in FIG. 4A so that a precursor layer containing the PMGI is formed. The thickness of the precursor layer here is about 1 micrometer. The precursor layer is then baked at about 210° C. for about 10 minutes so that a lower layer 11 composed of a PMGI layer is obtained (FIG. 4B). Here, the silicon substrate 10 is one example of an "underlying object." Likewise, the surface of the silicon substrate 10 on which the lower layer 11 is formed is an "underlying surface" for the lower layer 11. Throughout the present embodiment, a structure having an underlying object and at least one layer formed on the underlying object may also be referred to as a "base body."

Figure 4C:
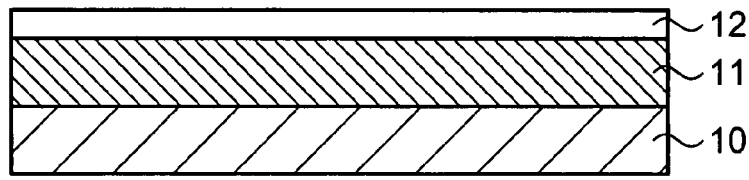

After the lower layer 11 is formed, a material containing poly(vinylidenefluoride-trifluoroethylene) (PVDF-TrFE) copolymer is spin-coated on the lower layer 11 so that a precursor layer containing the PVDF-TrFE copolymer is formed. The thickness of the precursor layer here is about 300 nm. The precursor layer is then baked at a temperature of about 120° C. for about 10 minutes so that a wetting modification layer 12 composed of a PVDF-TrFE copolymer layer is formed (FIG. 4C).

Figure 4D:
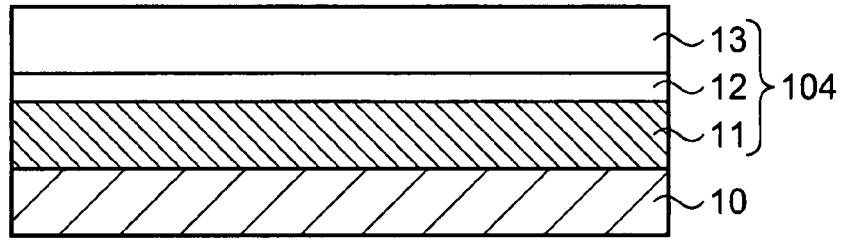

Then, a material containing polystyrene (PS) is spin-coated on the wetting modification layer 12 so that a precursor layer containing the PS is formed. The thickness of the precursor layer here is about 2 micrometers (μm). The precursor layer is then baked at a temperature of about 100° C. for about 10 minutes so that an upper layer 13 composed of a PS layer is formed (FIG. 4D). At this stage, the tri-layer structure 104 having the lower layer 11 the wetting modification layer 12 and the upper layer 13 is obtained.

Figure 13A:
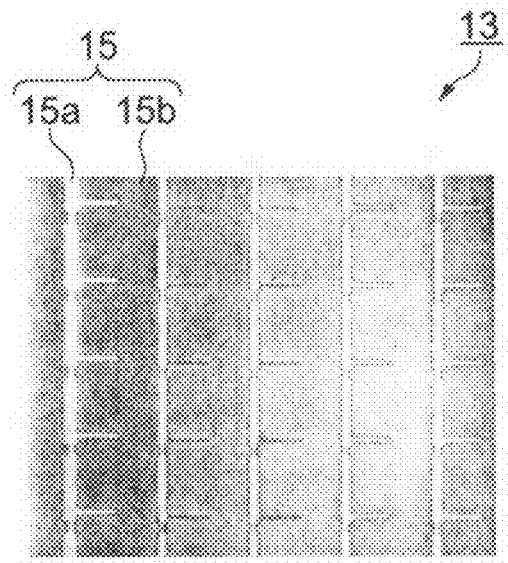
FIG. 13A shows a top surface of the embossed tri-layer structure of example 1 and FIG. 13B shows top surfaces of a bank structure obtained in example 1.
Figure 13B:
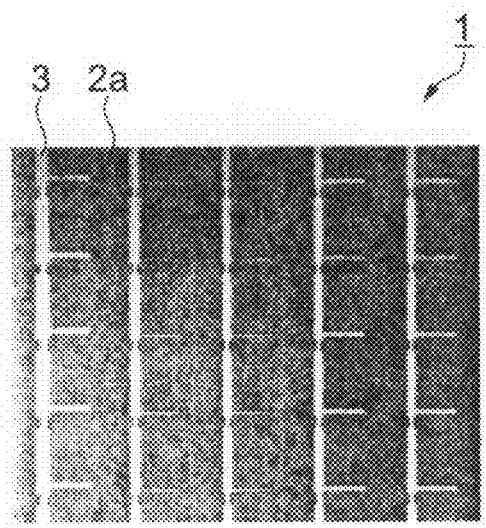

Next, as shown in FIG. 5A, the upper layer 13 is embossed so that a bank pattern 15 is provided in the upper layer 13. In this embodiment, a silicon stamp 51 having a pattern inverse to the bank pattern 15 is pressed onto the upper layer 13 at a temperature of about 120° C. with a pressure of about 30 Pa. Then, after the temperature of the upper layer 13 falls to room temperature, the silicon stamp 51 is removed from the upper layer 13. As a result, indentations 15a and protrusions 15b that define the bank pattern 15 are provided in the upper layer 13. The bank pattern 15 thus obtained is also shown in FIG. 13A.

Then, as shown in FIG. 5B, the bank pattern 15 is transferred from the upper layer 13 to the lower layer 11 through the wetting modification layer 12. Upon this transfer in this embodiment, with the upper layer 13 functioning as an etching mask, a plasma treatment using a mixture gas of $O_2$ and $CF_4$ (3:2) is applied to the tri-layer structure 104. The upper layer 13, the wetting modification layer 12 and the lower layer 11 are removed at portions corresponding to the indentations 15a of the upper layer 13. Meanwhile, the upper layer 13, the wetting modification layer 12 and the lower layer 11 remain at portions corresponding to the protrusions 15b of the upper layer 13. The bank structure 1 having the side surfaces 2b that define the indented regions 3 is thus obtained. The indented regions 3 correspond to the respective indentations 15a of the upper layer 13.

Then, as shown in FIG. 5C, an $O_2$ plasma treatment is applied to the bank structure 1 for a short time period so that the degree of hydrophilicity (or oleophilicity) of the side surfaces 2b increases. After the $O_2$ plasma treatment, the upper layer 13 that remains is removed in toluene. As a result, as shown in FIG. 5D, the separated surfaces of the etched wetting modification layer 12 are exposed as the top surfaces 2a of the bank structure 1.

The water contact angle of the separated surfaces of the etched wetting modification layer 12 is about 100°. The contact angle is less than 15° between the surface of the silicon substrate 10 and the surfaces of the etched lower layer 11 to which the $O_2$ plasma treatment was applied. Here, the separated surfaces of the etched wetting modification layer 12 are the top surfaces 2a of the bank structure 1, while the surfaces of the lower layer 11 to which the $O_2$ plasma treatment was applied are the side surfaces 2b of the bank structure 1. Thus, the top surfaces 2a and the side surfaces 2b of the bank structure 1 in this embodiment have mutually different wettability.

Then, as shown in FIG. 5E, a functional liquid 111 containing a predetermined material is provided in the indented regions 3 by the ink-jet printing method. In this embodiment, droplets of the functional liquid 111 are ejected from an ink-jet head 81 having piezo-elements so that the functional liquid 111 is provided in the indented regions 3.

The term "functional liquid" refers to a liquid material or a liquid-like material with a level of viscosity that allows it to be ejected as droplets from the nozzles of the ink-jet head 81. Here, the functional liquid may be aqueous or oil-like, provided it flows sufficiently (or has sufficiently low viscosity) to be ejected from the nozzles. The functional liquid may contain a solid material as long as the functional liquid maintains overall flowability. The viscosity of the functional liquid is preferably within a range of from 1 mPa·s to 50 mPa·s. If the viscosity is 1 mPa·s or higher, the circumference of the nozzles is scarcely contaminated with the functional liquid when it is ejected as droplets. Meanwhile, if the viscosity is 50 mPa·s or lower, the droplets may be ejected more smoothly because the nozzles clog less frequently.

Here, the predetermined material that the functional liquid contains may be, for instance, at least one of an electrically conductive material, a ferroelectric material, a semiconductor material, a dielectric material, and an electroluminescent material such as an organic EL material. According to the example, if the functional liquid contains the electrically conductive material, an electrically conductive pattern is obtained. Likewise, if the functional liquid contains the semiconductor material, a semiconductor pattern is obtained. If the functional liquid contains the dielectric material, a dielectric pattern is obtained. If the functional liquid contains the electroluminescent material, an electroluminescence pattern is obtained.

As described above, according to this embodiment, the bank structure 1 is defined by transferring the bank pattern 15 formed in the upper layer 13 that is embossed. As a result, the photolithography process may be omitted from the fabrication of the bank structure 1. Further, in this embodiment, the functional liquid 111 is provided in the indented regions 3 by the ink-jet printing method, and thus, high-resolution patterns may be achieved at reduced production costs. Moreover, according to this embodiment, the electronic devices may be fabricated at reduced production costs, because this embodiment may reduce the number of photolithography steps needed to form patterns such as electrically conductive lines, which may constitute one of the factors that increases the costs of device fabrication.

The thicker the upper layer 13 and the more deeply the silicon stamp 51 presses onto the upper layer 13, the greater is the depth of the indentations 15a. However, it may be difficult to remove the silicon stamp 51 from the upper layer 13 if the indentations 15a are too deep. For this reason, the indentations 15a are preferably relatively shallow. According to this embodiment, even if the indentations 15a are shallow, the depth of indented regions 3 defined by the bank structure 1 that is finally obtained may be equal to or greater than that of the indentations 15a, since the bank pattern 15 is transferred to the lower layer 11.

Modification of Example 1

The wetting modification layer 12 may be a fluoroalkylsilane (FAS) film. A method of forming the FAS film from its gas phase is as follows: a raw or starting compound, i.e., FAS, and the base body having the lower layer 11 are kept in an airtight container for about 2 to 3 days at room temperature, causing a self-assembled film, i.e., an FAS film, to form on the lower layer 11. If the airtight container is maintained at a temperature of about 100° C., the FAS film is formed on the lower layer 11 after about three hours. As mentioned above, a "base body" is a structure having an underlying object and at least one layer formed on the underlying object.

Further, a method of forming the FAS film from its liquid phase is as follows: a pre-treatment is first performed by irradiating the surface of the lower layer 11 with UV light, or by cleaning it with a solvent. The base body having the lower layer 11 is then dipped in a solution containing a raw compound (i.e., FAS), and then washed and dried so as to obtain a self-assembled film (the FAS film) on the lower layer 11. Alternatively, the pre-treatment of the surface of the lower layer 11 may be omitted.

Example 2

Another example of a method of fabricating a wetting contrast bank structure by the tri-layer process is described. In this embodiment, the wetting modification layer is composed of a surfactant. FIGS. 6A to 7D are referred to in the following descriptions.

The fabrication method of this embodiment includes providing on an underlying object a solution containing a surfactant and a material that is to compose a lower layer. Further, according to this embodiment, the surfactant moves toward a surface of the lower layer when the lower layer is obtained. As a result, a relatively thin wetting modification layer covering the lower layer is formed.

Figure 6A:
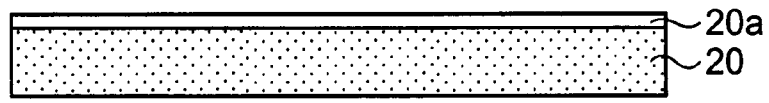
FIGS. 6A to 6D are diagrams showing a fabrication method of example 2.
Figure 6B:
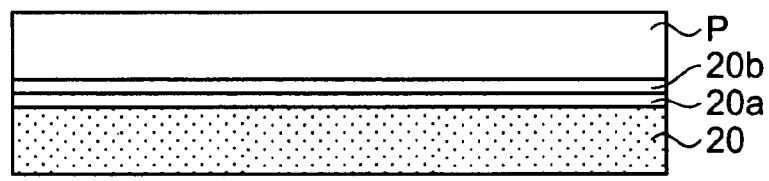
Figure 6C:
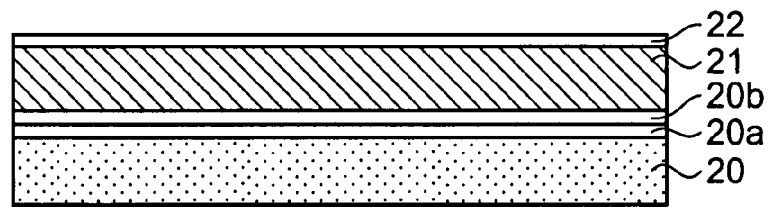
Figure 6D:
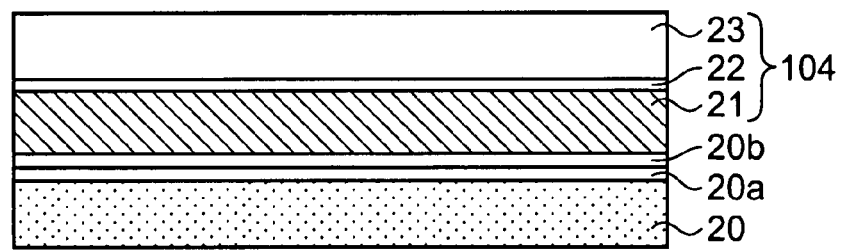

As shown in FIG. 6A, a glass substrate 20 coated with an ITO (indium tin oxide) layer 20a having the thickness of about 100 nm is washed in a solvent. Also, an $O_2$ plasma treatment is applied to the surface of the ITO layer 20a. The glass substrate 20 was then submerged in a tetradecane solution of 3-aminopropyltriethoxysilane (0.01 mol/l) for about 1 minute in order to form a self-assembled molecular layer (SAM) 20b of the 3-aminopropyltriethoxysilane on the ITO layer 20a (FIG. 6B). The SAM 20b increases adhesion between a subsequent coated polymer layer and its underlying surface, i.e., the surface of the ITO layer 20a. The SAM 20b of this embodiment is a mono-layer of molecules but may also be a layer consisting of more than mono-layer.

Next, as shown in FIG. 6B, a solution containing PMGI and a surfactant is spin-coated on the SAM 20b so that a precursor layer P is formed from the solution. The thickness of the precursor layer P here is about 1 micrometer. The precursor layer P is then baked at a temperature of about 120° C. for about 30 minutes. In this process the surfactant contained in the solution with the PMGI diffuses towards the surface of the precursor layer P. As a result, a lower layer 21 composed of a PMGI layer and a wetting modification layer 22 covering the lower layer 21 is obtained, the wetting modification layer 22 being composed of a surfactant layer. The water contact angle of the wetting modification layer 22 is measured to be 62°. The surface of the SAM 20b is the underlying surface for the lower layer 22.

Then, a material containing polystyrene is spin-coated on the wetting modification layer 22 so that a precursor layer containing the polystyrene is formed. The thickness of the precursor layer here is about 2 micrometers. The precursor layer is then baked at a temperature of about 100° C. for about 10 minutes so that an upper layer 23 composed of a polystyrene layer is formed. At this stage, a tri-layer structure 104 having the lower layer 21, the wetting modification layer 22 and the upper layer 23 is obtained.

Figure 7A:
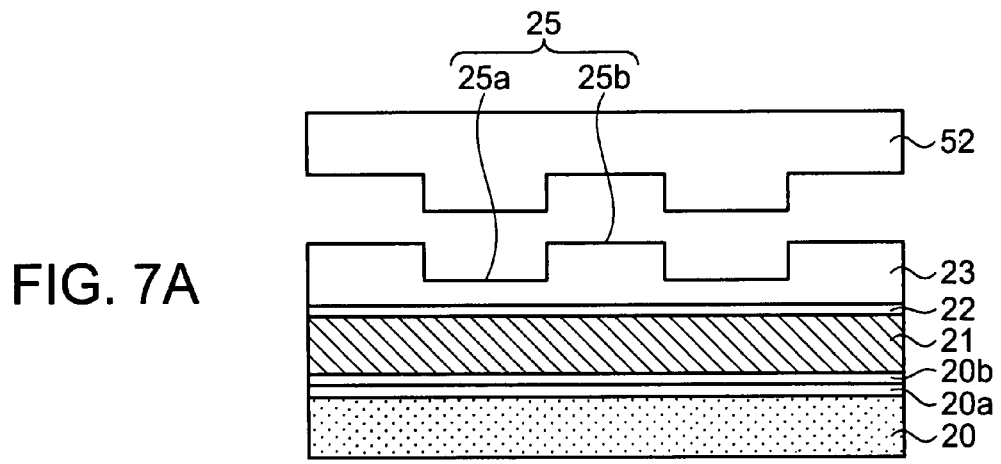
FIGS. 7A to 7D are diagrams showing the fabrication method of example 2.

Next, as shown in FIG. 7A, the upper layer 23 is embossed so that a bank pattern 25 is provided in the upper layer 25. In this embodiment, a silicon stamp 52 having a pattern inverse to the bank pattern 25 is pressed onto the upper layer 23 at a temperature of about 110° C. and with the pressure of about 30 Pa. Then, after the temperature of the upper layer 23 falls to room temperature, the silicon stamp 52 is removed from the upper layer 23. As a result, indentations 25a and protrusions 25b that define the bank pattern 25 are provided in the upper layer 23.

Figure 7B:
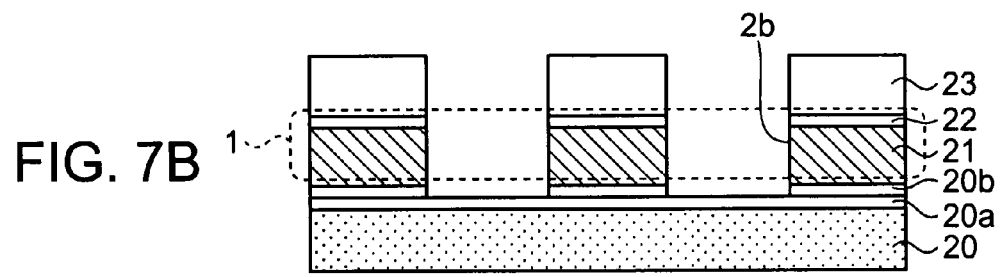

Then, as shown in FIG. 7B, the bank pattern 25 is transferred from the upper layer 23 to the lower layer 21 through the wetting modification layer 22. In this embodiment, a plasma treatment using a mixture gas of $O_2$ and $CF_4$ (3:2) is applied to the tri-layer structure 104, with the upper layer 23 functioning as an etching mask. The upper layer 23, the wetting modification layer 22 and the lower layer 21 are removed at portions corresponding to the indentations 25a of the upper layer 23. Meanwhile, the upper layer 23, the wetting modification layer 22 and the lower layer 21 remain at portions corresponding to the protrusions 25b of the upper layer 23.

As a result, openings penetrating through the tri-layer structure 104 and the SAM 20b appear, and the surface of ITO layer 20a is partially exposed by these openings. Thus, at this stage, the bank structure 1 has side surfaces 2b that define the indented regions 3. The indented regions 3 correspond to the respective indentations 25a of the upper layer 23.

Figure 7C:
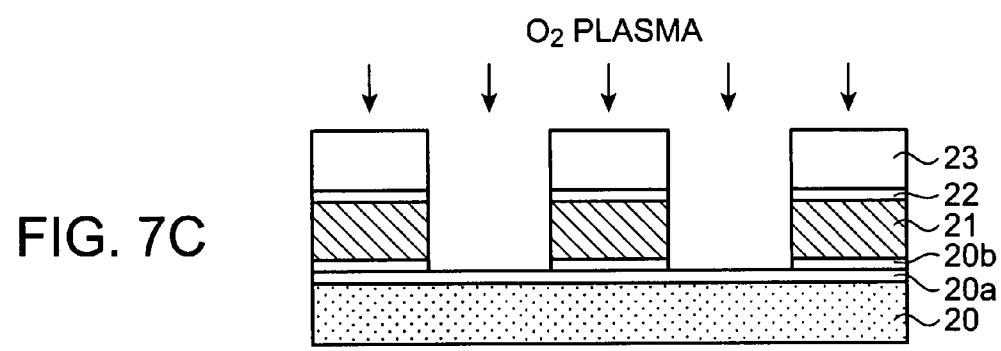

Then, as shown in FIG. 7C, a substantially pure $O_2$ plasma treatment is applied to the bank structure 1 for a short time period so that the degree of hydrophilicity (or oleophilicity) of the side surfaces 2b increases. This plasma treatment may be performed by the same apparatus used when transferring the bank pattern 25, and may be done continuously from the transfer process of the bank pattern 25.

Figure 7D:
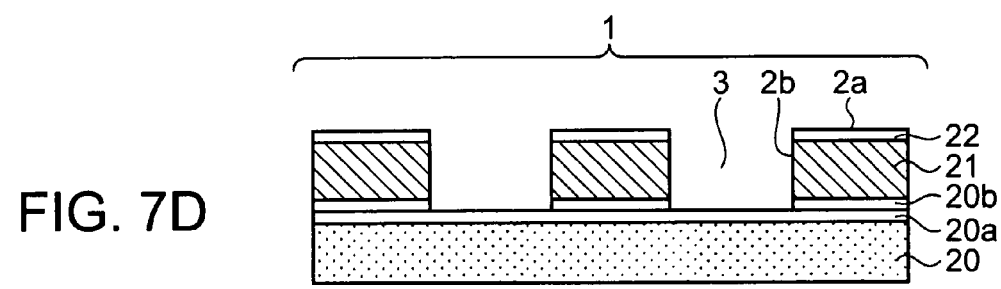
Figure 14:
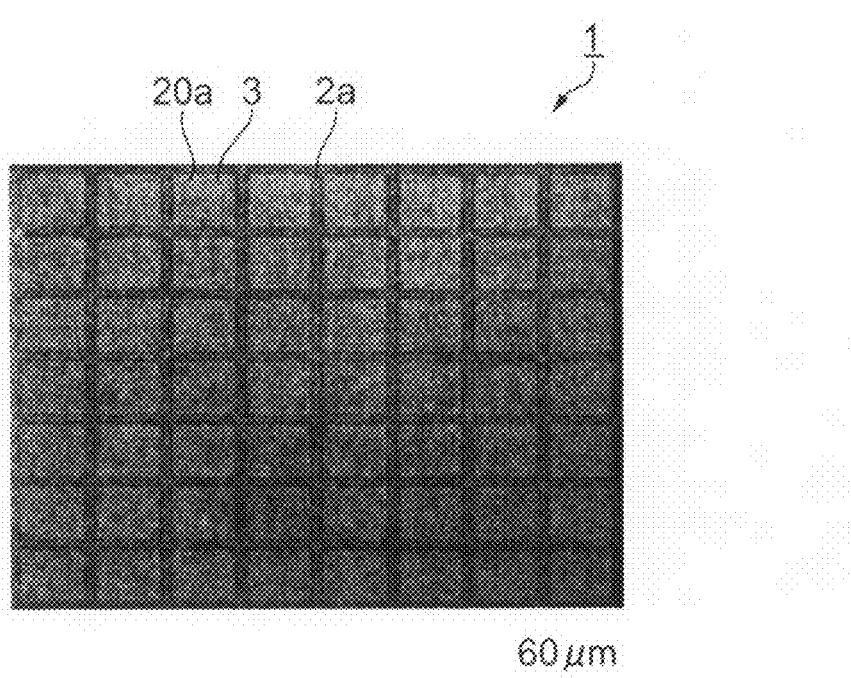
FIG. 14 shows top surfaces of a bank structure obtained in example 2.

Next, the remaining upper layer 23 is removed in toluene. Thus, as shown in FIG. 7D, the separated surfaces of the etched wetting modification layer 22 are exposed as top surfaces 2a of the bank structure 1. The bank structure 1 thus obtained is also shown in FIG. 14.

There is a difference, or contrast, in wettability between the top surfaces 2a and the side surfaces 2b of the bank structure 1 thus obtained. One quantitative measure used to indicate degrees of wettability is the contact angle. In this embodiment, the contact angle of each of the top surfaces 2a is about 52°, while that of each of the side surfaces 2b is about 15°. Therefore, the difference between the contact angles of the top surfaces 2a and that of the side surfaces 2b is about 37°. The greater the contact angle, the more hydrophobic or oleophobic is the corresponding surface.

The difference of approximately 37° between the contact angles may induce a dramatic difference in printing result. A contact angle difference such as this could be larger depending on the material selected for the lower layer 21 and the surfactant.

The bank structure 1 according to this embodiment is typical for the patterned electrochemical cells, and electrolytes may be deposited or provided by ink-jet printing into the cells.

TABLE 1

| | Treatments applied to the lower layer (PMGI layer) and wetting modification layer (surfactant layer) | Contact angles |
|---|---|---|
| a | Spin-coating and baking 120° C. to form the lower layer and wetting modification layer | 62° |
| b | Spin-coating and baking at 110° C. to form the upper layer (PS layer) and removing the PS layer in toluene | 52° |
| c | Oxygen plasma treatment | 15° |
| d | After oxygen plasma treatment, wash in toluene | 15° |

Table 1 shows the contact angles of the surfaces at respective stages of the above process. As shown in (a), when the lower layer 21 and the wetting modification layer 22 are obtained by spin-coating and baking, the contact angle of the surface of the wetting modification layer 22 is about 62°. Also, as shown in (b), when the upper layer 23 is formed on the wetting modification layer 23, and the upper layer 23 is later removed, the contact angle of the surface of the wetting modification layer 23 is about 52°. Further, as shown in (c), when the $O_2$ plasma treatment is applied to the lower layer 21, the contact angle of the surface of the lower layer 21 is about 15°. Finally, as shown in (d), when the $O_2$ plasma treatment is applied to the lower layer 21, and afterwards the lower layer 12 is submerged in toluene, the contact angle of the surface of the lower layer 21 is about 15°.

The above-mentioned difference of about 37° is the difference between the contact angles shown in (b) and (d) of Table 1.

According to the embodiment described above, the bank structure 1 is defined by transferring the bank pattern 25 formed in the upper layer 23 that is embossed. Therefore, the photolithography process may be omitted from the fabrication of the bank structure 1. Further, in this embodiment, the functional liquid is provided in the indented regions 3 by the ink-jet printing method, and thus high-resolution patterns may be achieved at reduced production costs. Moreover, according to this embodiment, the electronic devices may be fabricated at reduced production costs, because this embodiment may reduce the number of photolithography steps needed to form patterns such as electrically conductive lines.

The thicker the upper layer 23 and the more deeply the silicon stamp 52 presses onto the upper layer 23, the greater is the depth of the indentations 25a. However, it may be difficult to remove the silicon stamp 52 from the upper layer 23 if the indentations 25a are too deep. For this reason, the indentations 25a are preferably relatively shallow. According to this embodiment, even if the indentations 25a are relatively shallow, the depth of the indented regions 3 defined by the bank structure 1 that is finally obtained may be equal to or greater than that of the indentations 25a, since the bank pattern 25 is transferred to the lower layer 21.

Modification of Example 2

The method of forming the wetting modification layer 22 is not limited to the example described above. For instance, according to another example, a solution containing a mixture of a material that is to compose the lower layer 21 and a material that is to compose the wetting modification layer 22 is deposited on its underlying surface, and then the wetting modification layer 22 is formed from the thus provided solution by phase separation. Specifically, in this case the solution containing the mixture is obtained by co-dissolving polyarylamine (PAA) and poly(9,9'-dioctylfluoren-co-benzothiadiazole (F8BT) in a appropriate solvent including mesitylene. This solution, or co-solution, is then spin-coated on its underlying surface and then dried. As a result, the lower layer 21 composed of a PAA layer and the wetting modification layer 22 composed of a F8BT layer are obtained.

Example 3

An example of a method of fabricating the wetting contrast bank structure by the double-layer process is described. As described below, according to this embodiment, the wettability relationship between the top surfaces 2a and the side surfaces 2b is inverse to that in examples 1 and 2. Further, short vertical gaps are obtained according to this embodiment. FIGS. 8A to 9D are referred to in the descriptions below.

A material containing poly(4-vinylphenol) (PVP) is spin-coated on a glass substrate 30 (FIG. 8A) so that a precursor layer containing the PVP is formed. The thickness of the precursor layer here is about 1 micrometer. The precursor layer is then baked at a temperature of about 120° C. for about 10 minutes so that a lower layer 31 composed of a PVP layer (FIG. 8B) is formed. Here, the surface of the glass substrate 30 on which the lower layer 31 is formed is the underlying surface for the lower layer 31.

Figure 8A:
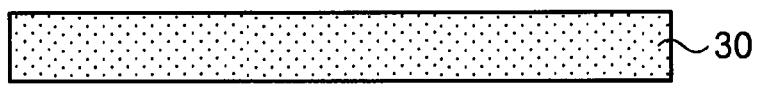
FIGS. 8A to 8D are diagrams showing a fabrication method of example 3.
Figure 8B:
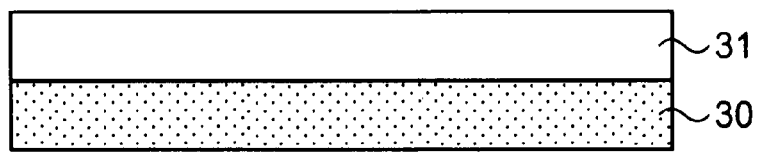
Figure 8C:
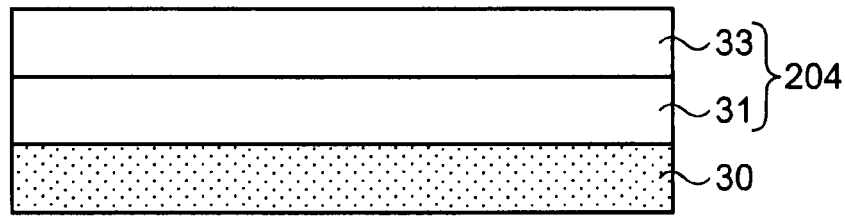

Then, a material containing polystyrene (PS) is spin-coated on the lower layer 31 so that a precursor layer containing the PS is formed. The thickness of the precursor layer here is about 1 micrometer (μm). The precursor layer is then baked at a temperature of about 100° C. for about 10 minutes so that an upper layer 33 composed of the PS layer is formed (FIG. 8C). As a result, a double-layer structure 204 having the lower layer 31 and upper layer 33 is obtained.

Figure 8D:
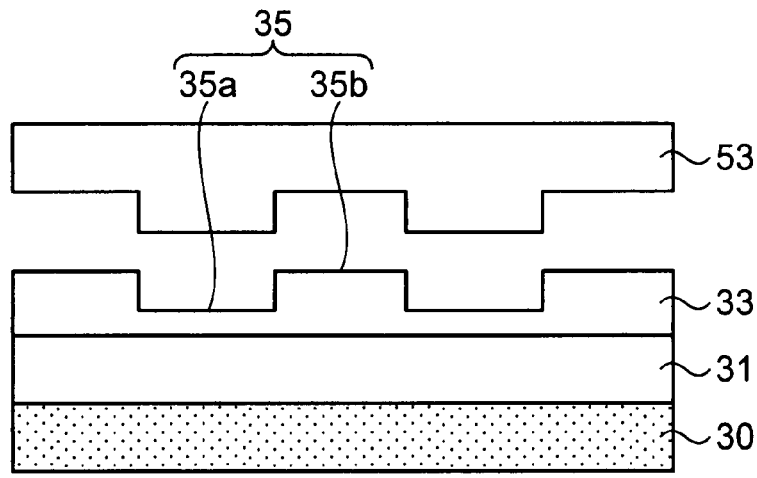

Next, as shown in FIG. 8D, the upper layer 33 is embossed so that a bank pattern 35 is provided in the upper layer 33. In this embodiment, a silicon stamp 53 having a pattern inverse to the bank pattern 35 is pressed onto the upper layer 33 at a temperature of about 110° C. at the pressure of about 30 Pa. Then, after the temperature of the upper layer 33 falls to room temperature, the silicon stamp 53 is removed from the upper layer 33. As a result, indentations 35a and protrusions 35b that define the bank pattern 35 are provided in the upper layer 23.

Figure 9A:
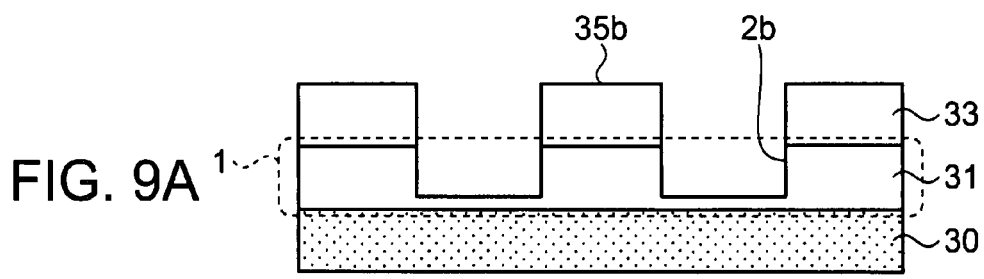
FIGS. 9A to 9D are diagrams showing the fabrication method of example 3.

Then, as shown in FIG. 9A, the bank pattern 35 is transferred from the upper layer 33 to the lower layer 31. In this embodiment, a plasma treatment using a mixture gas of $O_2$ and $CF_4$ (3:2) is applied to the double-layer structure 204, with the upper layer 33 functioning as an etching mask. Specifically, the lower layer 31 is etched until the thickness of the lower layer 31 decreases to 100 nanometers at portions corresponding to the indentations 35a. Meanwhile, the upper layer 33, the lower layer 31 remain at portions corresponding to the protrusions 35b. As a result, the bank structure 1 having the side surfaces 2b that define the indented regions 3 is obtained. The indented regions 3 correspond to the respective indentations 35a.

Figure 9B:
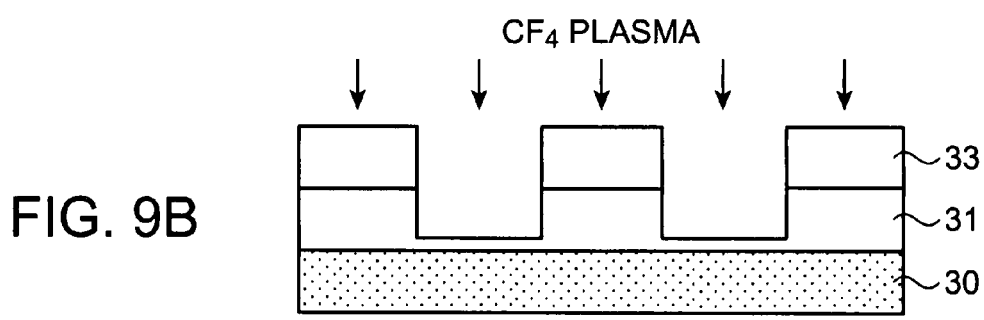

Next, as shown in FIG. 9B, a substantially pure $CF_4$ plasma treatment is applied to the bank structure 1 so that the degree of hydrophobicity (or oleophobicity) of the side surfaces 2b increases. This plasma treatment may be performed by the same apparatus used when transferring the bank pattern 35, and may be done continuously from the transfer process of the bank pattern 35.

Figure 9C:
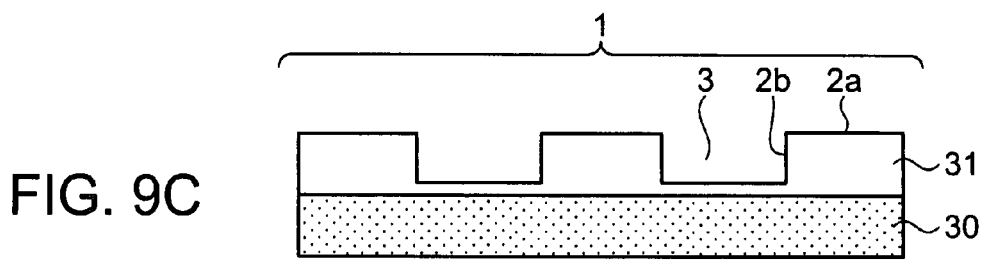

Then, the remaining upper layer 33 is removed in toluene. As a result, as shown in FIG. 9C, the separated surfaces of the etched lower layer 31 are exposed as the top surfaces 2a of the bank structure.

The contact angle of each of the top surfaces 2a thus obtained is about 50°, while the contact angle of each of the side surfaces 2b is about 105°. At this stage, unlike the bank structures 1 of examples 1 and 2, the degree of hydrophilicity of the top surfaces 2a is greater than that of the side surfaces 2b.

TABLE 2

| | Treatments to the lower layer (PVP layer) | Contact angles |
|---|---|---|
| a | Spin-coating and baking at 120° C. to form the lower layer | 50° |
| b | Spin-coating and baking at 100° C. to form the upper layer (PS layer) and removing the PS layer in toluene | 50° |
| c | $CF_4$ plasma treatment | 105° |
| d | After $CF_4$ plasma treatment, wash in toluene | 105° |

Table 2 shows the contact angles of the surface at respective stages of the above process. As shown in (a), when the lower layer 31 composed of the PVP layer is obtained by spin-coating and baking, the contact angle of the surface of the lower layer 31 is about 50°. Also, as shown in (b), when the upper layer 33 composed of the PS layer is removed after the upper layer 33 is formed on the lower layer 31 by spin-coating and baking, the contact angle of the surface of the lower layer 31 is about 50°. Further, as shown in (c), when the $CF_4$ plasma treatment is applied to the lower layer 31, the contact angle of the surface of the lower layer 31 is about 105°. Finally, when the lower layer 31 is submerged in toluene after the $CF_4$ plasma treatment, the contact angle of the surface of the lower layer 31 is about 105°.

Note that the contact angle of the top surfaces 2a corresponds to that shown in (b), while the contact angle of the side surfaces 2b corresponds to that shown in (d).

Figure 9D:
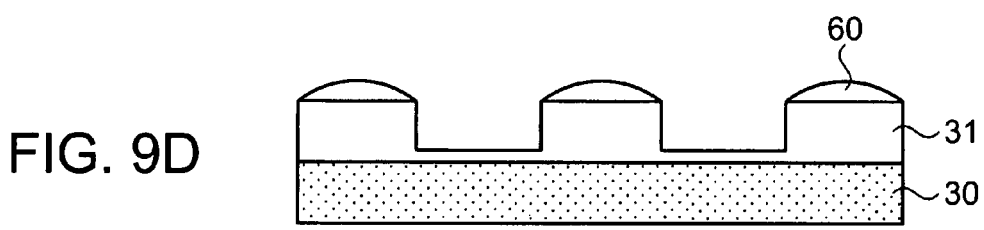

Next, a water-based PEDOT-PSS colloidal suspension is provided on the top surfaces 2a by an ink-jet process, and then the suspension thus provided is dried at a temperature of about 100° C. for about 10 minutes. As a result, electrically conductive lines 60 are obtained on the respective top surfaces 2a (FIG. 9D). PEDOT stands for poly(3,4-ethylenedioxythiophene), and PSS stands for poly(styrenesulfonate). The water-based PEDOT-PSS colloidal suspension is one example of the "functional liquid" mentioned above.

Figure 10A:
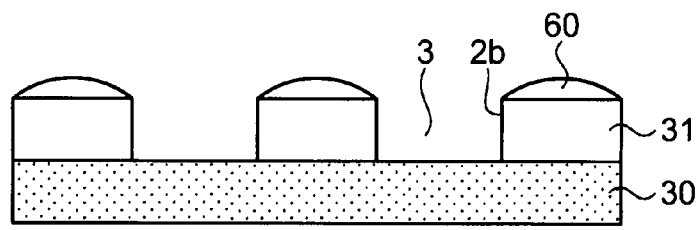
FIGS. 10A to 10C are diagrams showing the fabrication method of example 3.
Figure 10B:
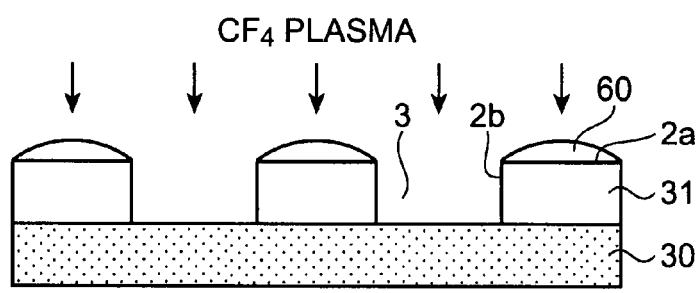
Figure 10C:
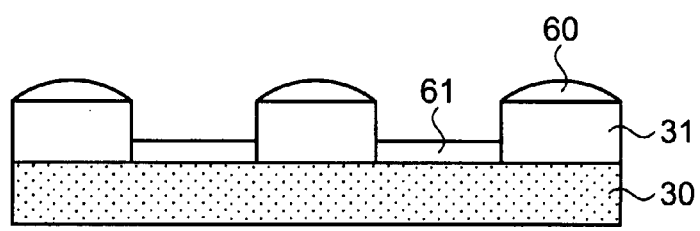

As the PEDOT-PSS is highly etch resistant, with the electrically conductive lines 60 functioning as etching masks, the lower layer 31 is etched by an $O_2$ plasma treatment so that the surface of the glass substrate 30 is exposed at portions corresponding to the indented regions 3, as shown in FIG. 10A. Then, as shown in FIG. 10B, a CF4 plasma treatment is applied to the thus exposed surface of the glass substrate 30 so that the hydrophilicity of the surface of the glass substrate 30 increases. Here, this CF4 plasma treatment provides high hydrophobicity to the side surfaces 2b of the bank structure 1; that is, to the surface of the PVP layer, and to the surfaces of the electrically conductive lines 60. Then, as shown in FIG. 10C, another ink-jet process is used to provide the water-based PEDOT-PSS colloidal suspension in the indented regions 3 having the bottom surfaces composed of the surface of the glass substrate 30. Electrically conductive lines 61 are then obtained in the respective indented regions 3 after the drying process mentioned above.

According to this embodiment, the electrically conductive lines 60 are obtained on the top surfaces 2a while the electrically conductive lines 61 in the indented regions 3. There is a gap between the top surfaces 2a and the bottom surfaces of the indented regions 3, the gap being caused by the thickness of the lower layer 31. Therefore, due to the gap, the density of the electrically conductive lines 60, 61 may be increased in a plane parallel to the surface of the glass substrate 30.

As described above, according to this embodiment, the bank structure 1 is defined by transferring the bank pattern 35 formed in the upper layer 33 that is embossed. Therefore, the photolithography process may be omitted from the fabrication of the bank structure 1. Further, in this embodiment, the functional liquid is provided in the indented regions 3 by the ink-jet printing method, and thus high-resolution patterns may be achieved at reduced production costs. Moreover, according to this embodiment, the electronic devices may be fabricated at reduced production costs, because this embodiment may reduce the number of photolithography steps needed to form patterns such as electrically conductive lines.

The thicker the upper layer 33 and the more deeply the silicon stamp 53 presses onto the upper layer 33, the greater is the depth of the indentations 35a. However, it may be difficult to remove the silicon stamp 53 from the upper layer 33 if the indentations 35a are too deep. For this reason, the indentations 35a are preferably relatively shallow. According to this embodiment, even if the indentations 35a are relatively shallow, the depth of indented regions 3 defined by the bank structure 1 that is finally obtained may be equal to or greater than that of the indentations 35a, since the bank pattern 35 is transferred to the lower layer 31.

Example 4

An example of a method of fabricating a uniform wettability bank structure by the double-layer process is described. FIGS. 11A to 12D are referred to in the following descriptions.

Figure 11A:
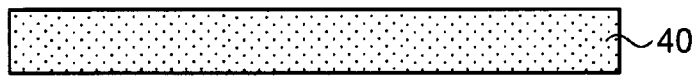
FIGS. 11A to 11D are diagrams showing a fabrication method of example 4.
Figure 11B:
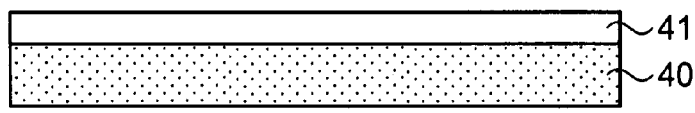

A material containing PMGI is spin-coated on a surface of a glass substrate 40 (FIG. 11A) so that a precursor layer containing the PMGI is formed. The thickness of the precursor layer here is about 50 nanometers. The precursor layer is then baked at a temperature of about 210° C. for about 10 minutes so that a lower layer 41 composed of a PMGI layer is formed (FIG. 11B). Here, the surface of the glass substrate 40 is the underlying surface for the lower layer 41.

In this embodiment, another precursor layer containing PMGI is formed on another glass substrate, though they are not shown in FIGS. 11A to 12D. The thickness of this other precursor layer is about 25 nanometers. Like the 50-nanometer precursor layer, this precursor layer is then baked at a temperature of about 210° C. for about 10 minutes so that another lower layer that is less thick than the lower layer 41 is formed. Hereinafter, the descriptions proceed with respect to the thicker lower layer 41, but the processes used for the lower layer 41 are also applied to the other lower layer.

Figure 11C:
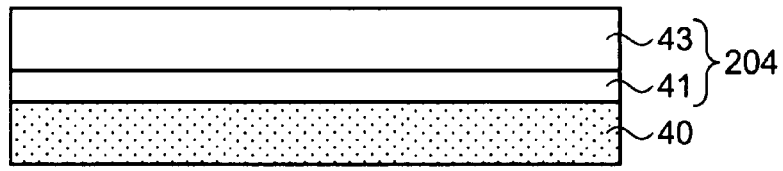

Then, a material containing poly(methyl methacrylate) (PMMA) is spin-coated so that a precursor layer containing the PMMA is formed. The thickness of the precursor layer here is about 1 micrometer. The precursor layer is then baked at a temperature of 120° C. for about 10 minutes so that an upper layer 43 composed of a PMMA layer is formed (FIG. 11C). As a result, a double-layer structure 204 having the lower layer 41 and the upper layer 43 is obtained.

Figure 11D:
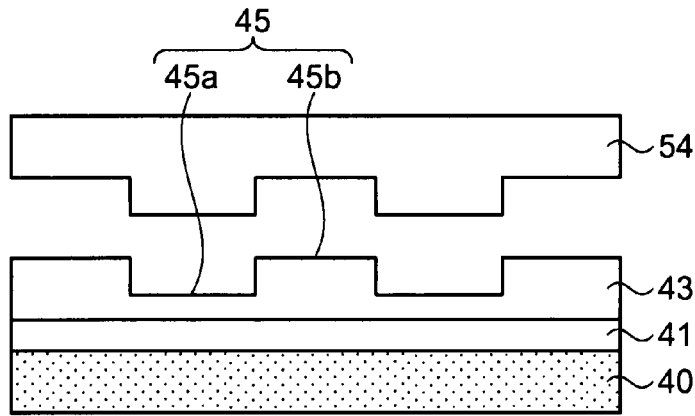

Next, as shown in FIG. 11D, the upper layer 43 is embossed so that a bank pattern 45 is provided in the upper layer 43. In this embodiment, a silicon stamp 54 having a pattern inverse to the bank pattern 45 is pressed onto the upper layer 43 at a temperature of about 160° C. with the pressure of about 30 Pa. Then, after the temperature of the upper layer 43 falls to room temperature, the silicon stamp 54 is removed from the upper layer 43. As a result, indentations 45a and protrusions 45b that define the bank pattern 45 are obtained in the upper layer 43.

Figure 12A:
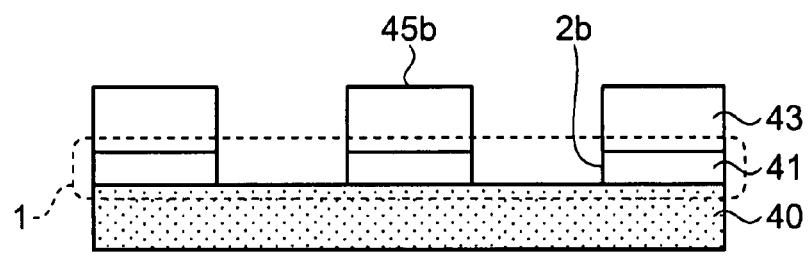
FIGS. 12A to 12D are diagrams showing the fabrication method of example 4.

Then, as shown in FIG. 12A, the bank pattern 45 is transferred from the upper layer 43 to the lower layer 41. In this embodiment, the double layer structure 204 is etched, with the upper layer functioning as an etching mask. The upper layer 43 and the lower layer 41 are removed or etched at portions corresponding to the indentations 45a, while the upper layer 43 and the lower layer 41 remain at portions corresponding to the protrusions 45b. As a result, the bank structure 1 having side surfaces 2b that define the indented regions 3 is obtained. The indented regions 3 correspond to the respective indentations 45a.

Figure 12B:
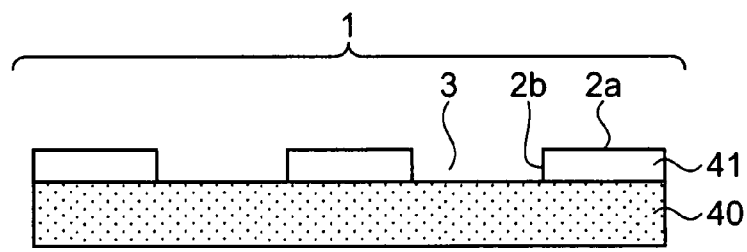

Then, the remaining upper layer 43 is removed in acetone. Thus, as shown in FIG. 12B, the separated surfaces of the lower layer 43 that was etched are exposed as the top surfaces 2a of the bank structure 1.

Figure 12C:
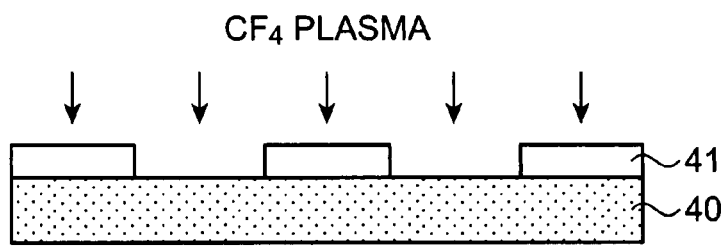
Figure 12D:
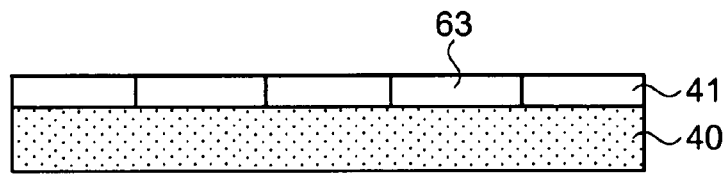

Next, as shown in FIG. 12C, a $CF_4$ plasma treatment is applied to the bank structure 1. Here, the top surfaces 2a and the side surfaces 2b are the surfaces of the lower layer 41 composed of the PMGI layer. The top surfaces 2a and the side surfaces 2b become more hydrophobic when exposed to the $CF_4$ plasma. On the other hand, the bottom surfaces of the indented regions 3 are the surface of the glass substrate 40, and these bottom surfaces become more hydrophilic when exposed to the $CF_4$ plasma Therefore, although there is no difference in wettability between the top surfaces 2a and the side surfaces 2b, there is a difference in wettability between the top surfaces 2a and the bottom surfaces of the indented regions 3 and between the side surfaces 2b and the bottom surfaces of the indented regions 3.

Then, water-based silver colloidal suspension is provided in the indented regions 3 so that electrically conductive lines 63 are formed after a drying process. The thickness of each of the electrically conductive lines 63 is about 60 nanometers where the bank structure is formed from the thicker lower layer 41, and about 20 nanometers where the bank structure 1 is formed from the other lower layer. The water-based silver colloidal suspension is one example of the "functional liquid" mentioned above.

Figure 15:
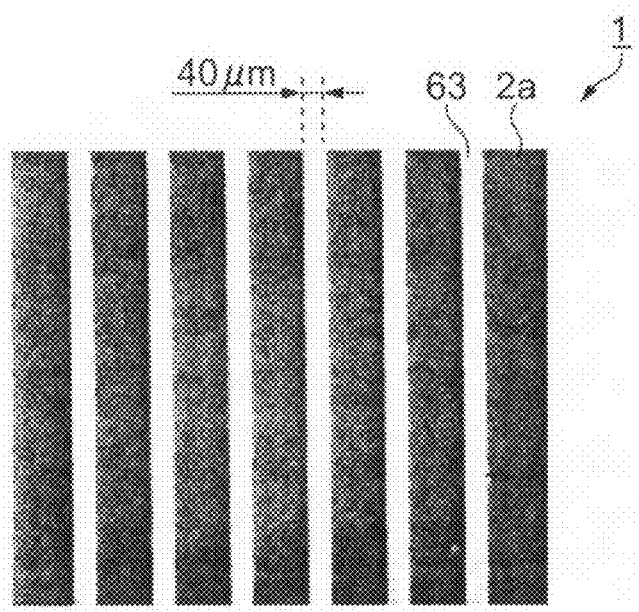
FIG. 15 shows top surfaces of electrically conductive lines of example 4.

FIG. 15 shows the electrically conductive lines 63 of this embodiment that are thus obtained. As shown in FIG. 15, the shapes of the respective electrically conductive lines 63 are finely defined. The method of this embodiment is preferable for fabricating a relatively thin or thick bank structure 1 over a relatively large area, and contrary to this embodiment, this type of bank structure may not be easy to obtain by embossing a single-layer structure.

Each of the indented regions 3 is in the form of a trench having the width of about 40 micrometers. Here, when a droplet of the functional liquid having the diameter of about 20 micrometers is provided on a predetermined surface, it spreads on the surface to cover a circle-like area having the diameter of about 50 micrometers. According to this embodiment, each of the areas on which the respective electrically conductive lines 63 are formed constitutes the indented regions 3 defined by the bank structure 1, and thus each of the widths of the electrically conductive lines 63 is less than the width or diameter of the range in which the droplet spreads.

According to the embodiment described above, the bank structure 1 is defined by transferring the bank pattern 45 provided in the embossed upper layer 43. Therefore, the photolithography process may be omitted from the fabrication of the bank structure 1. Further, in this embodiment, the functional liquid is provided in the indented regions 3 by the ink-jet printing method, and thus high-resolution patterns may be achieved at reduced production costs. Moreover, according to this embodiment, the electronic devices may be fabricated at reduced production costs, because this embodiment may reduce the number of photolithography steps needed to form patterns such as electrically conductive lines.

Moreover, unlike examples 1, 2 and 3, the thickness of the lower layer 41 according to example 4 is less than that of the upper layer 43. Thus, according to examples 1 to 4, the thickness of the lower layer, which occupies a major part of the bank structure, may be greater than, equal to or less than that of the upper layer.

The following modifications may be applied to at least one of examples 1 to 4.

Modification 1

According to examples 1 to 4, the spin-coating is used for providing materials that are to compose respective layers in the multi-layer structures. However, instead of the spin-coating, at least one of, for instance, doctor blading, printing (for instance, screen printing, offset printing, flexo printing, pad printing, ink-jet printing, evaporation), sputtering, chemical vapor deposition, dip and spray coating, and electroless plating may be used.

Modification 2

According to examples 1 to 4, the plasma treatment is used for etching the multi-layer structures. However, instead of the plasma treatment, at least one of, for instance, laser ablation, corona discharge treatments, UV-ozone treatments, wet-chemical etching including solvent dissolution and chemical dissolution may be used.

Modification 3

The methods described in examples 1 to 4 are preferable for fabricating electronic devices and electronic circuits over a relatively large area. A material provided in the indented regions 3 defined by the bank structures of examples 1 to 4 may be at least one of, for instance, an electrically conductive material, a dielectric material, a semiconductor material, a polymer solution, a colloid suspension, and a colloids suspension of inorganic materials.

Modification 4

According to examples 1 to 4, the plasma treatment is used to change the wettability of the side surfaces 2b of the bank structure 1. However, instead of the plasma treatment, at least one of, for instance, a UV ray irradiation process and a process for forming an FAS film on the side surfaces 2b may be used.

Modification 5

According to examples 1 to 4, when the silicon stamp is pressed onto the upper layer, the upper layer is heated to a temperature equal to or greater than the glass transition temperature of the upper layer. As explained below, however, it is not necessary to heat the upper layer.

Specifically, a stamp that is transparent to UV rays is used in this modification. A surface of this stamp is provided with the same pattern as the stamp 51 in example 1.

A photocurable material is then spin-coated on the lower layer so that a precursor layer containing the photocurable material is formed. Then, the stamp is pressed onto the precursor layer. When the stamp is being pressed, the precursor layer is irradiated with UV light so that the photocurable material cures. The precursor layer cures in response to the pattern of the stamp so as to be an upper layer. Afterwards, the stamp is removed from the upper layer that is thus formed. As a result, a bank pattern is obtained in the upper layer.

In this modification, the stamp is transparent to UV rays, and thus the precursor layer is irradiated with the UV rays from the stamp side through the stamp. However, if the lower layer, the wetting modification layer and the substrate are transparent to the UV rays, the precursor layer may be irradiated from the substrate side.

Thus, according to this modification, the heating process and the accompanying cooling process when the stamp is pressed may be omitted, thereby enabling the time necessary for fabricating the bank structure to be reduced.

Modification 6

According to examples 1 to 4, when the silicon stamp is pressed onto the upper layer, the upper layer is heated to a temperature equal to or greater than the glass transition temperature of the upper layer. As explained below, however, it is not necessary to heat the upper layer.

For instance, with respect to example 4, HSQ (Hydrogen silsesquioxane) available from Dow Corning may be used instead of PMMA. In this case, HSQ is spin-coated on the lower layer so that a precursor layer containing HSQ is formed. Then, the precursor layer is pre-baked at a temperature of about 50° C. so that an upper layer composed of a HSQ layer is formed. According to the upper layer thus obtained, even if the upper layer is not heated when the stamp is pressed onto the upper layer, a bank pattern may be provided in the upper layer by embossing, for instance, at room temperature.

According to this modification, the heating process and the accompanying cooling process when the stamp is pressed may be omitted, thereby enabling the time necessary for fabricating the bank structure to be reduced. SOG (Spin-on- Glass) available from Tokyo Ohka Kogyo Co., Ltd. may be used instead of HSQ, with substantially the same result.

What is claimed is:

1. A method of fabricating a structure, the method comprising:
   forming a first layer over a substrate;
   forming a second layer over the first layer;
   embossing the second layer to form a protrusion and an indentation in the second layer, a thickness of a portion of the second layer at the protrusion being larger than a thickness of a portion of the second layer at the indentation;
   etching the first layer and the second layer to remove at least a part of the second layer, and a part of the first layer corresponding to the indentation of the second layer to form an indentation and a protrusion in the first layer, whereby the indentation in the second layer is substantially removed, the first and second layers forming a bank structure;
   treating the bank structure to increase the degree of lyophobicity of a side surface of bank structure in the first layer;
   removing the second layer from the substrate;
   disposing a functional liquid on the top surface of the protrusion of the first layer;
   subsequently removing the indentation in the first layer to expose a surface of the substrate;
   treating the bank structure to increase the lyophilicity of the surface of the substrate and to increase the lyophobicity of a side surface of the protrusion;
   disposing the functional liquid between side surfaces of the bank structure in a region corresponding to the indentation in the first layer after treating the surface of the substrate; and
   forming electronic circuitry with the functional liquid.

2. The method according to claim 1, wherein the second layer is etched by plasma treatment during the etching step.

3. The method according to claim 1, wherein the second layer is embossed by pressing a stamp to a surface of the second layer during the embossing step.

4. The method according to claim 1, wherein an area of the indentation is surrounded by an area of the protrusion.

5. The method according to claim 1, wherein an area of the protrusion is surrounded by an area of the indentation.

6. The method according to claim 1, wherein an area of the protrusion is divided into a plurality of parts by an area of the indentation.

7. The method according to claim 1, wherein a margin between the protrusion and the indentation is at least 2 µm.

8. A method of fabricating a structure, the method comprising:
   forming a first layer over a substrate;
   forming a second layer over the first layer;
   pressing a stamp to the second layer to form a protrusion and an indentation;
   removing a portion of the second layer, and a part of the first layer corresponding to the indentation of the second layer to form an indentation and a protrusion in the first layer, whereby the indentation in the second layer is substantially removed, the first and second layers forming a bank structure;
   treating the bank structure to increase the degree of lyophobicity of a side surface of the bank structure in the first layer;
   disposing a functional liquid on the top surface of the protrusion of the first layer;
   subsequently removing the indentation in the first layer to expose a surface of the substrate;
   treating the bank structure to increase the lyophilicity of the surface of the substrate and to increase the lyophobicity of a side surface of the protrusion;
   disposing the functional liquid between side surfaces of the bank structure in a region corresponding to the indentation in the first layer after treating the surface of the substrate; and
   forming electronic circuitry with the functional liquid.

9. A method of fabricating an electronic circuit, including a method of fabricating a structure according to claim 1.

10. A method of fabricating an electronic device, including a method of fabricating a structure according to claim 1.

* * * * *